US006588002B1

(12) United States Patent
Lampaert et al.

(10) Patent No.: US 6,588,002 B1
(45) Date of Patent: Jul. 1, 2003

(54) METHOD AND SYSTEM FOR PREDICTIVE LAYOUT GENERATION FOR INDUCTORS WITH REDUCED DESIGN CYCLE

(75) Inventors: Koen Lampaert, Irvine, CA (US); Andy Brotman, Irvine, CA (US); Paolo Miliozzi, Irvine, CA (US); Paramjit Singh, Lake Forest, CA (US); Mishel Matloubian, Irvine, CA (US); Bijan Bhattacharyya, Irvine, CA (US); Francis M Rotella, Tustin, CA (US); Rajesh Divecha, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 107 days.

(21) Appl. No.: 09/941,883

(22) Filed: Aug. 28, 2001

(51) Int. Cl.[7] ............................................... G06F 17/50
(52) U.S. Cl. ..................... 716/8; 716/12; 703/2; 703/16
(58) Field of Search ........................ 716/8–14; 703/2, 703/14–16

(56) References Cited

U.S. PATENT DOCUMENTS

| | | | | |
|---|---|---|---|---|
| 5,243,547 A | * | 9/1993 | Tsai et al. ..................... | 703/14 |
| 5,467,291 A | * | 11/1995 | Fan et al. ..................... | 703/14 |
| 5,666,288 A | * | 9/1997 | Jones et al. .................. | 716/17 |
| 5,751,591 A | * | 5/1998 | Asada ........................... | 716/1 |
| 6,161,212 A | * | 12/2000 | Seely ............................ | 716/4 |
| 6,175,947 B1 | * | 1/2001 | Ponnapalli et al. ............ | 716/5 |
| 6,219,630 B1 | * | 4/2001 | Yonezawa et al. ............ | 703/14 |
| 6,237,126 B1 | * | 5/2001 | Bonitz .......................... | 716/4 |
| 6,311,145 B1 | * | 10/2001 | Hershenson et al. .......... | 703/2 |
| 6,334,100 B1 | * | 12/2001 | Ahrikencheikh et al. ..... | 703/14 |
| 6,345,380 B1 | * | 2/2002 | Bonaccio et al. ............. | 716/12 |
| 6,381,730 B1 | * | 4/2002 | Chang et al. ................. | 716/5 |
| 6,421,814 B1 | * | 7/2002 | Ho ................................. | 716/5 |
| 6,424,959 B1 | * | 7/2002 | Bennett, III et al. .......... | 706/13 |
| 6,487,705 B1 | * | 11/2002 | Roethig et al. ................ | 716/6 |

(List continued on next page.)

FOREIGN PATENT DOCUMENTS

JP     2000-193687 A   *   7/2000     ........... G01R/19/00

OTHER PUBLICATIONS

Nikejad et al., "Analysis, Design, and Optimization of Spiral Inductors and Transformers for SI RF IC's", IEEE, Journal of Solid–State Circuits, vol. 33, No. 10, Oct. 1998, pp. 1470–1481.*

Koutsoyannopoulos et al., "Systematic Analysis and Modeling of Integrated Inductors and Transformers in RF IC Design", IEEE Transactions on Circuits and Systems—II: Analog and Digital Signal Processing, vol. 47, No. 8, Aug. 2000, pp. 699–713.*

(List continued on next page.)

*Primary Examiner*—Matthew Smith
*Assistant Examiner*—Phallaka Kik
(74) *Attorney, Agent, or Firm*—Farjami & Farjami LLP (57) ABSTRACT

In one embodiment, a number of parameter values for an inductor, such as a spiral inductor, are received. Examples of the parameter values are Number of Turns, Spacing, Width, Xsize, and Ysize parameter values. From the received parameter values, a number of parasitic values for a subcircuit model of the inductor are determined. For example, parasitic resistor values and parasitic capacitor values of the inductor are determined. The parasitic resistor values and parasitic capacitor values are used in simulating the circuit comprising the inductor. An inductor layout is then generated that results in parasitic values that are the same as the parasitic values already used in simulating the circuit comprising the inductor. As such, the parasitic values of the inductor have already been taken into account in the initial circuit simulation and, there is no need to extract the internal parasitics of the inductor for further circuit simulations.

40 Claims, 7 Drawing Sheets

U.S. PATENT DOCUMENTS

| | | | | |
|---|---|---|---|---|
| 6,493,853 | B1 | * 12/2002 | Savithri et al. | 716/5 |
| 6,499,131 | B1 | * 12/2002 | Savithri et al. | 716/5 |
| 6,519,741 | B2 | * 2/2003 | Yaguchi et al. | 716/1 |
| 2002/0056070 | A1 | * 5/2002 | Tanaka | 716/2 |
| 2002/0104063 | A1 | * 8/2002 | Chang et al. | 716/4 |
| 2002/0188920 | A1 | * 12/2002 | Lampaert et al. | 716/10 |
| 2003/0055613 | | * 3/2003 | Tsai | 703/2 |

OTHER PUBLICATIONS

Christensen et al., "Easy Simulation and Design of On–Chip Inductors in Standard CMOS Processes", Proceedings of 1998 IEEE International Symposium on Circuits and Systems, vol. 4, May 31, 1998, pp. 360–364.*

Bartoli et al., "High–Frequency Models of Ferrite Cores Inductors", 20th IEEE International Conference on Industrial Electronics, Control and Instrumentation, vol. 3, Sep. 5, 1994, pp. 1670–1675.*

Koutsoyannopoulos et al., "Novel Si Integrated Inductor and Transformer Structures for RF IC Design", Proceedings of the 1999 IEEE International Symposium on Circuits and Systems, vol. 2, May 30, 1999, pp. 573–576.*

Bartoli et al., "Modeling Litz–wire Winding Losses in High–Frequency Power Inductors", $27^{th}$ Annual IEEE Power Electronics Specialists Conference, vol. 2, Jun. 23, 1996, pp. 1690–1696.*

Martin et al., "A New Lumped–Elements Power–Combining Amplifier Based on an Extended Resonance Technique", IEEE Transactions on Microwave Theory and Techniques, vol. 48, No. 9, Sep. 2000, pp. 1505–1515.*

Chandrakasan, Anantha P.: "Scanning the Issue," Proceedings of the IEEE, vol. 88, No. 10, Oct., 2000, pp. 1525–1527.

Miliozzi, Paolo; Kundert, Ken; Lampaert, Koen; Good, Pete; and Chian, Mojy: "A Design System for RFIC: Challenges and Solutions," Proceedings of the IEEE, vol. 88, No. 10, Oct., 2000, pp. 1613–1631.

* cited by examiner

Spiral Inductor

302 Input Values Column　　　　344 Calculated Values Column

| Spiral Inductor Parameters | |
|---|---|
| Number of Turns | |
| Spacing | |
| Width | |
| Xsize | |
| Ysize | |
| Input Frequency Parameters | |
| Operating Freq | |
| Start Freq | |
| End Freq | |
| Freq Step | |

| Output Parameters | |
|---|---|
| PeakQ | |
| FPeakQ | |
| SRF | |
| QHalfSRF | |
| Subcircuit Model Parameters | |
| Ls | |
| Cp | |
| Rp | |
| Rs | |
| Cox1 | |
| Cox2 | |
| Csub1 | |
| Csub2 | |
| Rsub1 | |
| Rsub2 | |

METHOD AND SYSTEM FOR PREDICTIVE
LAYOUT GENERATION FOR INDUCTORS
WITH REDUCED DESIGN CYCLE

BACKGROUND OF THE INVENTION

1. Field of the Invention

The present invention is generally in the field of circuit design. More specifically, the present invention is in the field of designing circuits including at least one inductor.

2. Background Art

The demand for advanced consumer electronic devices, such as cellular phones, information assistants, and personal computers, has challenged semiconductor manufacturers to reduce the time-to-market for the integrated circuits ("IC") these products contain. In an effort to meet that challenge, semiconductor manufacturers use automated design systems that provide the designer with sets of tools and methodologies that reduce the entire design cycle of the IC.

A typical IC design system includes a design cycle that comprises various steps. For example, the steps in an IC design cycle can include circuit design and simulation, circuit layout generation, circuit layout verification, and extraction of parasitics from the circuit layout. The initial circuit design and simulation is performed before the designer has knowledge of the exact layout of the entire circuit, which is generated later in the design cycle. As a result, the designer has to attempt to predict and counteract the effect of various parasitics that might be introduced during layout design, which can severely degrade circuit performance.

Timing, voltage levels, and race conditions have to be re-verified after the designer knows of exact parasitics, such as parasitic capacitance, resistance, and inductance, extracted from circuit layout. Thus, a new circuit simulation incorporating correct values of the extracted parasitics from the circuit layout is required. Even then, the new circuit layout will often result in different values of extracted parasitics. Some parasitics may be eliminated, some new ones may be introduced, and some may increase or decrease, as such resulting in the need to redesign and re-simulate the circuit. The above steps are repeated, where the circuit design is modified by re-extracted parasitics from the circuit layout.

Without precise knowledge of the effect circuit modifications have on parasitics extracted from the circuit layout, the designer has to continually attempt to predict what new parasitics might be generated from the latest circuit modifications. Thus, the circuit's design cycle continues through numerous, time consuming iterations until the circuit layout parasitics have been correctly taken into account during the circuit design and simulation cycle. This repetitious cycle can result in many days or weeks of delay in completion of the circuit design for large circuit blocks. The resulting increase in "time-to-market" causes a tremendous economic loss to semiconductor design houses and manufacturers.

Figure 1:
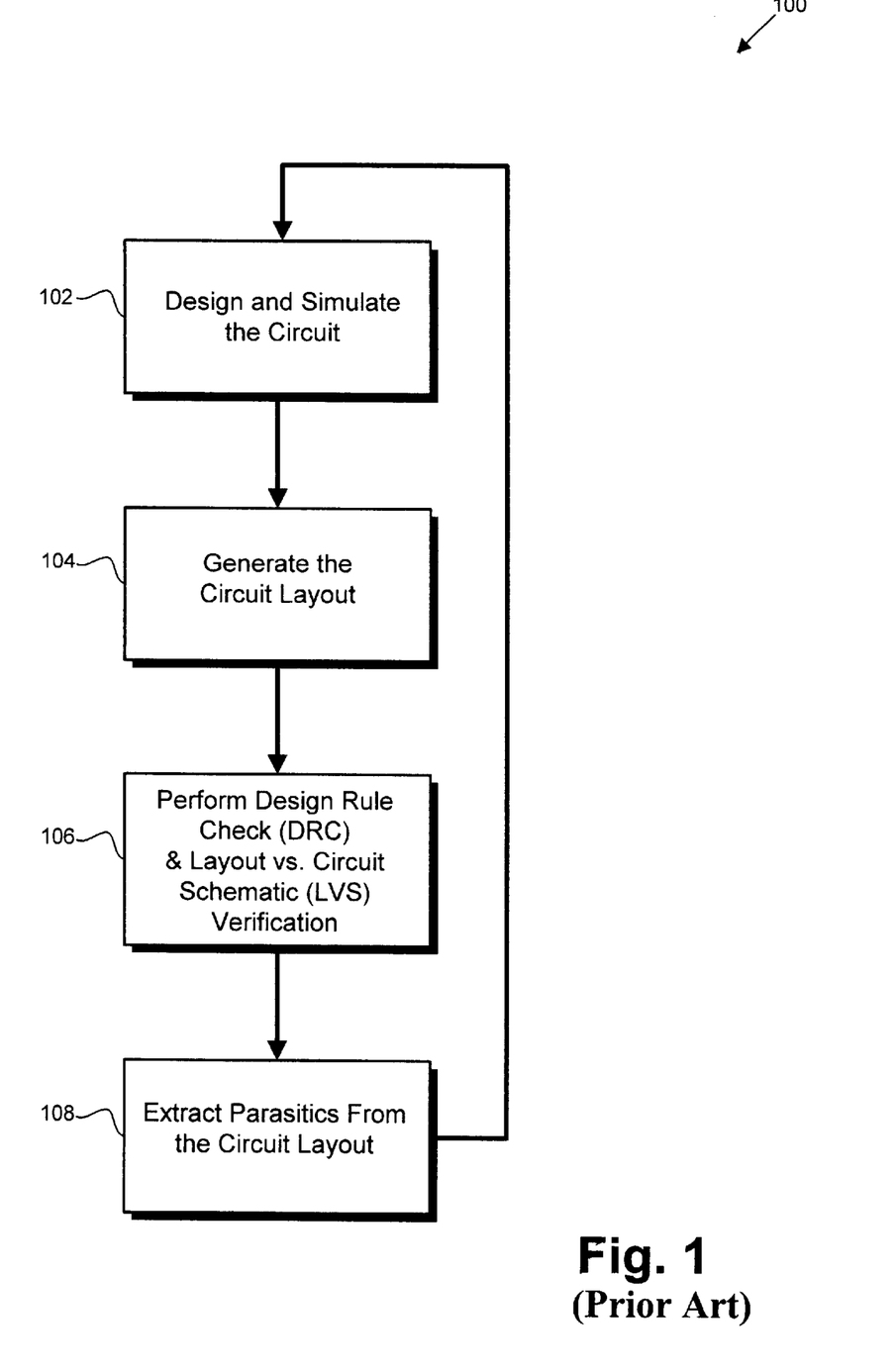
FIG. 1 is a flowchart of steps taken in a conventional circuit design cycle.

FIG. 1 shows flowchart 100, which illustrates a typical sequence of steps in a circuit's design, layout, and verification. In step 102 in FIG. 1, a circuit is designed and a schematic for the circuit is made. The circuit is also simulated in step 102. The circuit can be designed with the assistance of a commercial circuit design editor, such as Composer®, by Cadence Design Systems®, Inc. A simulation program can simulate the electrical behavior of a circuit using the parameters that were input for the circuit's components. The circuit simulation can be written and performed, for example, by using the SPECTRE® program. However, the accuracy of the results obtained from the circuit simulation depend on the accuracy of all the circuit components, including a large number of parasitic components in the actual layout of the circuit, whose values cannot generally be accurately estimated by conventional design techniques.

In step 104, a circuit layout is generated using a layout generator. The layout generator program can be written in SKILL®, C++, a combination of the two languages, or a combination of a number of other languages. In step 106 in FIG. 1, a design rule check ("DRC") and a layout versus circuit schematic ("LVS") verification is performed on the circuit layout generated in step 104. DRC is performed to ensure that the circuit layout conforms to all manufacturing specifications. For example, the DRC program identifies problems such as "minimum-spacing" violations and "minimum-width" violations. In LVS, the circuit layout is checked against the circuit schematic to ensure electrical equivalence. In other words, the circuit layout is checked to see that it corresponds to the circuit schematic. By way of example, the LVS checking can be implemented using the Calibre® program and a rule file written in Calibre° format.

In step 108, parasitics are extracted from the circuit layout. For example, in an inductor's layout, both the inductor's "internal" parasitics and the parasitics generated by the interconnect routing between the inductor and other circuit components are extracted. The inductor's internal parasitics can include, among other things, the capacitance between the inductor metal segments and the substrate, and the series resistance of the inductor.

It is noted that the inductor's internal parasitics have a great effect on circuit performance. The internal and interconnect routing parasitics are used by the circuit designer to modify the circuit schematic in step 102, and the circuit design cycle comprising steps 102, 104, 106, and 108 begins anew. A modified circuit layout is generated in step 104, and DRC and LVS are performed on the modified circuit layout in step 106. In step 108, parasitics are again extracted from the modified circuit layout. Thus, the circuit design cycle comprising steps 102, 104, 106, and 108 as discussed above is repeated until circuit design and simulation step 102 can be performed with a high degree of confidence in the parasitic values that correspond to the circuit layout. As discussed above, the repetitive circuit design cycle significantly increases the time-to-market for integrated circuits.

Some design systems attempt to limit the repetitive circuit design cycle for integrated circuits comprising an inductor by limiting the designer's choice of parameters corresponding to the inductor to a pre-selected number of values. For example, a design system for an integrated circuit comprising an inductor may offer a circuit designer a limited choice of fixed values for input parameters "total width" and "total length" of the inductor's layout. Since the parasitics of inductors with a limited number of fixed parameter values can be extracted, and thus determined in advance, the repetitive circuit design cycle for integrated circuits comprising those inductors, i.e. with fixed parameter values, can be reduced. However, these design systems attain a reduction in the repetitive circuit design cycle by severely limiting a circuit designer's flexibility in designing integrated circuits comprising inductors.

Therefore, there exists a need for an integrated design system that provides a reduction in the time-to-market for integrated circuits comprising inductors. More specifically, there exists a need for an integrated design system that is able to predict the parasitics that will result from an inductor layout before the layout is generated, and thereby minimize undesirable repetition of the circuit design cycle.

SUMMARY OF THE INVENTION

The present invention is directed to method and system for predictive layout generation for inductors with reduced design cycle. The invention provides a reduction in the time-to-market for integrated circuits comprising inductors. More specifically, the invention is an integrated design system that is able to predict the parasitics that will result from an inductor layout before the layout is generated, thereby minimizing undesirable repetitions in the circuit design cycle.

In one embodiment, the invention receives a number of parameter values for an inductor, such as a spiral inductor. Examples of the parameter values are Number of Turns, Spacing, Width, Xsize, and Ysize parameter values. From the received parameter values, a number of parasitic values for a subcircuit model of the inductor are determined. For example, parasitic resistor values and parasitic capacitor values of the inductor are determined. The parasitic resistor values and parasitic capacitor values are used in simulating the circuit comprising the inductor.

According to the present invention, an inductor layout is then generated that results in parasitic values that are the same as the parasitic values already used in simulating the circuit comprising the inductor. As such, the parasitic values of the inductor have already been taken into account in the initial circuit simulation and there is no need to extract the internal parasitics of the inductor for further circuit simulations.

DETAILED DESCRIPTION OF THE INVENTION

The present invention is directed to method and system for predictive layout generation for inductors with reduced design cycle. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 2:
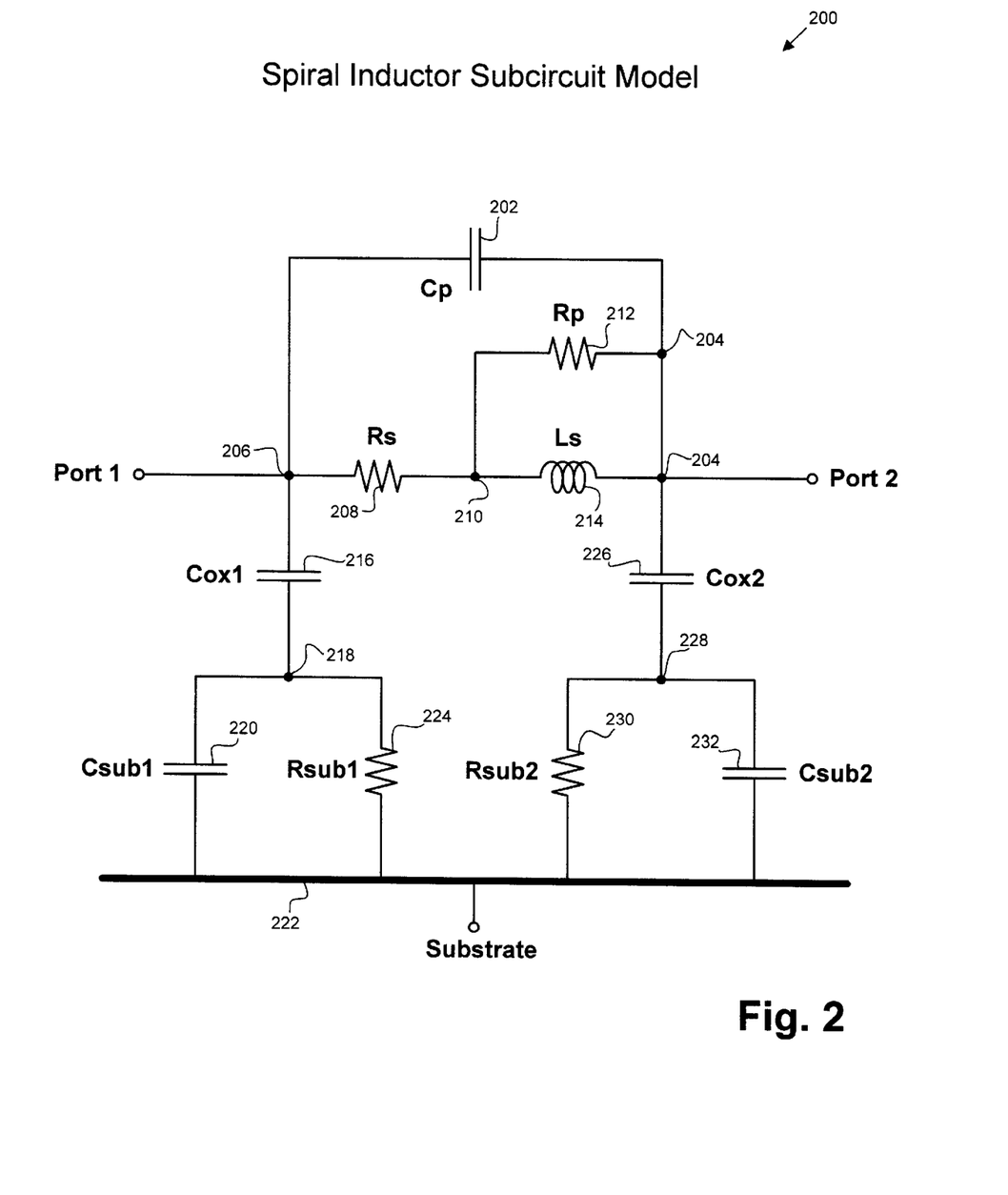
FIG. 2 shows a schematic diagram of an exemplary spiral inductor subcircuit model in accordance with one embodiment of the present invention.

For the purpose of ease of illustration, the present invention is described with specific reference to a common inductor layout called "spiral inductor." However, it is manifest that the concepts of the present invention apply to inductors other than those laid out as spiral inductors. Spiral inductor subcircuit model 200 in FIG. 2 is a schematic diagram of an exemplary spiral inductor subcircuit model in accordance with one embodiment of the present invention. Spiral inductor subcircuit model 200 illustrates the internal parasitic resistances and capacitances of a spiral inductor comprising a first end at port 1, also referred to as terminal 1, and a second end at port 2, also referred to as terminal 2. Inductor Ls 214 in FIG. 2 represents an ideal inductor without internal parasitic resistances and capacitances, hence referred to as an "ideal" inductor.

In FIG. 2, capacitor Cp 202 is connected between node 204 and node 206. Node 206 is also referred to as port 1 of the spiral inductor. Resistor Rs 208 is connected between node 206 and node 210. Resistor Rp 212 is connected between node 210 and node 204. Ideal inductor Ls 214 is connected between node 210 and node 204. Node 204 is also referred to as port 2 of the spiral inductor. Capacitor Cox1 216 is connected between node 206 and node 218. Capacitor Csub1 220 is connected between node 218 and substrate 222. Resistor Rsub1 224 is also connected between node 218 and substrate 222. Capacitor Cox2 226 is connected between node 204 and node 228. Resistor Rsub2 230 is connected between node 228 and substrate 222. Capacitor Csub2 232 is also connected between node 228 and substrate 222.

The present invention's spiral inductor subcircuit model 200 in FIG. 2 is a simulation model that is used to precisely predict the electrical behavior of a spiral inductor that is laid out using spiral inductor parameters "Number of Turns," "Spacing," "Width." "Xsize," and "Ysize." Parasitic resistors Rp 212, Rs 208, Rsub1 224, and Rsub2 230, and parasitic capacitors Cp 202, Cox1 216, Cox2 226, Csub1 220, and Csub2 232 in FIG. 2 represent the internal parasitic resistances and capacitances of a spiral inductor laid out in the manner specified by spiral inductor parameters "Number of Turns," "Spacing," "Width," "Xsize," and "Ysize."

The spiral inductor parameter "Number of Turns" determines the number of turns of spiral inductor metal segments in a spiral inductor layout. The spiral inductor parameter "Spacing" determines the spacing between adjacent metal segments in the spiral inductor layout. The spiral inductor parameter "Width" determines the width of spiral inductor metal segments in the spiral inductor layout. The spiral inductor parameters "Xsize" and "Ysize," respectively, determine the total width of spiral inductor in the "x" direction and the total length of spiral inductor in the "y" direction. Spiral inductor parameters "Number of Turns," "Spacing," "Width," "Xsize," and "Ysize" will be discussed in greater detail in relation to FIGS. 3, 4, and 5. As discussed below, spiral inductor subcircuit model 200 uses the above listed spiral inductor parameters to calculate values of parasitic resistors Rp 212, Rs 208, Rsub1 224, and Rsub2 230, and parasitic capacitors Cp 202, Cox1 216, Cox2 226, Csub1 220, and Csub2 232 in FIG. 2.

In one embodiment of the invention, the values of Rs 208, the spiral inductor parasitic series resistance, and Rp 212, the spiral inductor parasitic parallel resistance, are affected by spiral inductor parameters "Number of Turns," "Width," "Xsize," and "Ysize." Moreover, the values of Rsub1, the parasitic resistance from the substrate to the oxide below the inductor metal, and Rsub2, the parasitic resistance from the substrate to the oxide below the inductor metal, are affected by spiral inductor parameters "Number of Turns," "Spacing," "Width," "Xsize," and "Ysize."

The value of Cp 202, the parasitic parallel capacitance of the spiral inductor, is affected by spiral inductor parameters "Number of Turns," "Spacing," "Width," "Xsize," and "Ysize." The values of Cox1 216 and Cox2 226, i.e. the parasitic capacitances between the spiral inductor's metal segments and the substrate, are also affected by spiral inductor parameters "Number of Turns," "Spacing," "Width," "Xsize," and "Ysize." Also, the values of Csub1 220, the parasitic capacitance of the substrate situated below port 1, and Csub2 232, the parasitic capacitance of the substrate situated below port 2, are affected by spiral inductor parameters "Number of Turns," "Spacing," "Width," "Xsize," and "Ysize."

Continuing with FIG. 2, the value of Ls 214, the ideal inductor in spiral inductor subcircuit model 200, is dependent on spiral inductor parameters "Number of Turns," "Xsize," and "Ysize." Thus the present invention utilizes spiral inductor subcircuit model 200 in FIG. 2 and works in conjunction with other components of the present invention, such as the spiral inductor parameters "Number of turns," "Spacing," "Width," "Xsize," and "Ysize," to predict the parasitic resistance and capacitance values associated with a particular layout of a spiral inductor, even before a circuit containing the spiral inductor, and the spiral inductor itself, are laid out.

Figure 3:
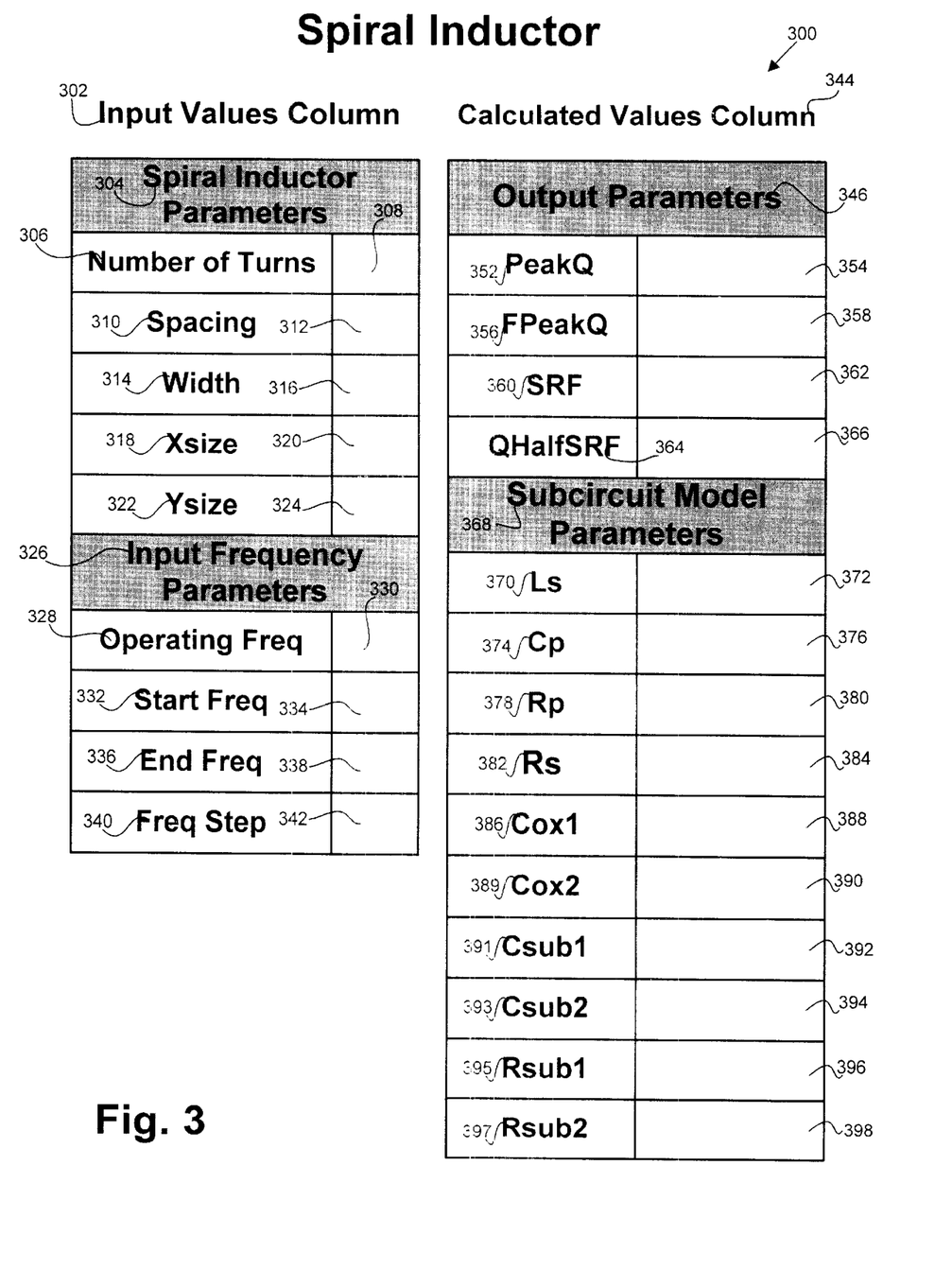
FIG. 3 shows various input, output, and subcircuit model parameters of an exemplary spiral inductor according to one embodiment of the present invention.

FIG. 3 shows table 300 comprising a column of input values and a column of calculated values for a spiral inductor in accordance with one embodiment of the present invention. Input Values Column 302 includes Spiral Inductor Parameters 304 and Input Frequency Parameters 326. Spiral Inductor Parameters 304 comprises Number of Turns 306, Spacing 310, Width 314, Xsize 318, and Ysize 322. Number of Turns 306, Spacing 310, Width 314, Xsize 318, and Ysize 322 are exemplary spiral inductor parameters utilized in an exemplary embodiment of the present invention to predict the parasitics of a spiral inductor layout that will be generated using the same spiral inductor parameters listed above. The parameters listed above can be input in a circuit schematic and will be discussed below.

In FIG. 3, spiral inductor parameter Number of Turns 306 determines the number of turns of spiral inductor metal segments in a spiral inductor layout. For example, if the value of spiral inductor parameter Number of Turns 306 were equal to 5.0, the spiral inductor metal would have 5.0 turns in a spiral inductor layout. The value of spiral inductor parameter Number of Turns 306 in the above example can be indicated in field 308, and the value can also be input in a circuit schematic. The value of Number of Turns 306 equal to 5.0 in the above example can also be input in a simulation program prior to the generation of the spiral inductor layout. In the present application, the numerical value of parameter Number of Turns 306 is also referred to as a "number of turns parameter value."

Continuing with FIG. 3, spiral inductor parameter Spacing 310 determines the distance between adjacent spiral inductor metal segments in a spiral inductor layout. For example, if the value of Spacing 310 were equal to 3.0 microns, the distance between adjacent segments of spiral inductor metal would be 3.0 microns in a spiral inductor layout. The value of Spacing 310 equal to 3.0 microns in the above example can be indicated in field 312, and the value can also be input in a circuit schematic. The value of Spacing 310 equal to 3.0 microns in the above example can also be input in a simulation program prior to the generation of the spiral inductor layout. In the present application, the numerical value of parameter Spacing 310 is also referred to as a "spacing parameter value."

Also shown in FIG. 3, spiral inductor parameter Width 314 determines the width of a spiral inductor metal segment in a spiral inductor layout. It is noted that in the present embodiment of the invention, all segments of spiral inductor metal in a spiral inductor layout are of equal width. For example, in an exemplary spiral inductor, if the value of spiral inductor parameter Width 314 is equal to 4.0 microns, the width of any segment of spiral inductor metal is also 4.0 microns. A value of Width 314 can be indicated in field 316, and can also be input in a circuit schematic. The value of Width 314 equal to 4.0 microns in the above example can also be input in a simulation program prior to spiral inductor layout generation. In the present application, the numerical value of parameter Width 314 is also referred to as a "width parameter value."

Further shown in FIG. 3, spiral inductor parameter Xsize 318 determines the total "width" of the spiral inductor in the "x" direction. For example, if the value of spiral inductor parameter Xsize 318 is equal to 200.0 microns, the spiral inductor has a total width of 200.0 microns in the "x" direction. A value of spiral inductor parameter Xsize 318 can be indicated in field 320, and can also be input in a circuit schematic. The value of Xsize 318 equal to 200.0 microns in the above example can also be input in a simulation program prior to the generation of the spiral inductor layout. In the present application, the numerical value of parameter Xsize 318 is also referred to as an "Xsize parameter value."

Also shown in FIG. 3, spiral inductor parameter Ysize 322 determines the total "length" of the spiral inductor in the "y" direction. For example, if the value of spiral inductor parameter Ysize 322 is equal to 200.0 microns, the spiral inductor has a total length of 200.0 microns in the "y" direction. A value of spiral inductor parameter Ysize 322 can be indicated in field 324, and can also be input in a circuit schematic. The value of Ysize 322 equal to 200.0 microns in the above example can also be input in a simulation program prior to the generation of the spiral inductor layout. In the present application, the numerical value of parameter Ysize 322 is also referred to as a "Ysize parameter value."

Also shown in FIG. 3, Input Frequency Parameters 326 include Operating Freq 328, Start Freq 332, End Freq 336, and Freq Step 340. Operating Freq 328, Start Freq 332, End Freq 336, and Freq Step 340 are exemplary spiral inductor input frequency parameters utilized in an exemplary embodiment of the present invention, along with Spiral Inductor Parameters 304 discussed above, to simulate the electrical behavior of the spiral inductor.

In FIG. 3, Operating Freq 328 designates the intended operating frequency of a spiral inductor. For example, in an exemplary spiral inductor, a value of Operating Freq 328 of 1.8 Giga Hertz ("GHz") can be indicated in field 330 in FIG. 3. The value of Operating Freq 328 of 1.8 GHz in the above example can also be input in a simulation program, along with the values of other input frequency parameters and spiral inductor parameters, to simulate the behavior of the spiral inductor. Also shown in FIG. 3, Start Freq 332 determines the starting frequency of a range of frequencies used to simulate the behavior of the spiral inductor. For example, in an exemplary spiral inductor, a value of Start Freq 332 of 100.0 MHz can be indicated in field 334, and the value can also be input in a simulation program, along with the values of other spiral inductor parameters, to simulate the behavior of the spiral inductor.

Further shown in FIG. 3, End Freq 336 determines the ending frequency of range of frequencies used to simulate the behavior of the spiral inductor. For example, in an exemplary spiral inductor, a value of End Freq 336 of 12.0 GHz can be indicated in field 338 and the value can also be input in a simulation program, along with the values of other spiral inductor parameters, to simulate the behavior of the spiral inductor.

Also shown in FIG. 3, Freq Step 340 determines the resolution of the simulation program used to "step through" the frequency range beginning with Start Freq 332 and ending with End Freq 336 to simulate the behavior of the spiral inductor. For example, in an exemplary spiral inductor, a value of Freq Step 340 equal to 100.0 megahertz ("MHz") can be indicated in field 342. By way of further example, values of Start Freq 332, End Freq 336, and Freq Step 340, respectively, equal to 100.0 MHz, 12.0 GHz, and 100.0 MHz, can be input in a simulation program to instruct the simulation program to "step through" a range of frequencies from 100.0 MHz to 12.0 GHz in 100.0 MHz steps to simulate the behavior of the spiral inductor.

Now turning attention to Calculated Values Column 344 of table 300 in FIG. 3, Calculated Values Column 344 includes Output Parameters 346 and Subcircuit Model Parameters 368. Output Parameters 346 further include PeakQ 352, FpeakQ 356, SRF 360, and QHalfSRF 364. PeakQ 352, FpeakQ 356, SRF 360, and QHalfSRF 364 are exemplary spiral inductor output parameters determined by Spiral Inductor Parameters 304 and Input Frequency Parameters 326 in an exemplary embodiment of the present invention. Output Parameters 346 can be calculated "on the fly" to reflect a change in any or all of the values of Spiral Inductor Parameters 304 and Input Frequency Parameters 326. It is noted that the present invention does not limit input values of Spiral Inductor Parameters 304 and Input Frequency Parameters 326 to pre-selected fixed values. In other words, the present invention allows a choice of input values of Spiral Inductor Parameters 304 and Input Frequency Parameters 326 that is continuous within a range that is limited only by circuit design constraints.

The output parameters listed above are now discussed. In FIG. 3, PeakQ 352 refers to the "peak" or maximum value of the quality factor ("Q") of a spiral inductor with a set of values that are input in Input Values Column 302. For example, in an exemplary spiral inductor, a value of PeakQ 352 equal to 5.842 can be indicated in field 354. The value of PeakQ 352 can be calculated "on the fly" to reflect a change in any or all of the values in Input Values Column 302.

Also shown in FIG. 3, FPeakQ 356 refers to the frequency at which the maximum value of Q occurs for a spiral inductor with a set of values that are input in Input Values Column 302. For example, in an exemplary spiral inductor, a value of FpeakQ 356 of 1.83278 GHz, which corresponds to a value of PeakQ 352 equal to 5.842, can be indicated in field 358. The value of FPeakQ 356 can also be calculate "on the fly" to reflect a change in any or all of the values in Input Values Column 302.

Continuing with FIG. 3, SRF 360 refers to the self-resonant frequency of a spiral inductor with a set of values that are input in Input Values Column 302. For example, in an exemplary spiral inductor, a value of SRF 360 equal to 7.67447 GHz can be indicated in field 362. Similarly, output parameter SRF 360 can also be calculated "on the fly" to reflect a change in any or all of the values in Input Values Column 302. Also in FIG. 3, QHalfSRF 364 refers to the value of Q that occurs at one half the self-resonance frequency of a spiral inductor with a set of values that are input in Input Values Column 302. For example, in an exemplary spiral inductor, a value of QHalfSRF 364 equal to 3.43462 GHz can be indicated in field 366. Output parameter QHalfSRF 364 can also be calculated "on the fly" to reflect a change in any or all of the values in Input Values Column 302.

Now discussing Subcircuit Model Parameters 368 shown in FIG. 3, Subcircuit Model Parameters 368 include Ls 370, Cp 374, Rp 378, Rs 382, Cox1 386, Cox2 389, Csub1 391, Csub2 393, Rsub1 395, and Rsub2 397, respectively, which correspond to Ls 214, Cp 202, Rp 212, Rs 208, Cox1 216, Cox2 226, Csub1 220, Csub2 232, Rsub1 224, and Rsub2 230 in FIG. 2. Ls 370, Cp 374, Rp 378, Rs 382, Cox1 386, Cox2 389, Csub1 391, Csub2 393, Rsub1 395, and Rsub2 397 are exemplary spiral inductor subcircuit model parameters affected by Spiral Inductor Parameters 304 in an exemplary embodiment of the present invention. The subcircuit model parameters listed above will be discussed below.

In FIG. 3, the value of Ls 370, the inductance of a spiral inductor, can be indicated in field 372. For example, in an exemplary spiral inductor, a value of Ls 370 equal to 7.15895 nano Henries ("nH") can be indicated in field 372. The value of Cp 374, the spiral inductor's parasitic parallel capacitance, can be indicated in field 376. For example, in an exemplary spiral inductor, a value of Cp 374 equal to 1.90671 femto Farads ("fF") can be indicated in field 376.

Continuing with FIG. 3, the value of Rp 378, the parasitic parallel resistance of a spiral inductor, can be indicated in field 380. For example, in an exemplary spiral inductor, a value of Rp 378 equal to 4355.45 ohms can be indicated in field 380. The value of Rs 382, the parasitic series resistance of a spiral inductor, can be indicated in field 384. For example, in an exemplary spiral inductor, a value of Rs 382 equal to 8.76181 ohms can be indicated in field 380.

The value of Cox1 386, the first parasitic capacitance between the spiral inductor's metal segments and the substrate (see FIG. 2), can be indicated in field 388. The value of Cox2 389, the second parasitic capacitance between the spiral inductor's metal segments and the substrate (see FIG. 2), can be indicated in field 390. The value of Csub1 391, the first parasitic capacitance of the substrate below the spiral inductor, and the value of Csub2 393, the second parasitic capacitance of the substrate below the spiral inductor, can be indicated in fields 392 and 394, respectively.

The value of Rsub1 395, the parasitic resistance of the substrate to the oxide below the inductor metal, can be indicated in field 396. The value of Rsub2 397, the parasitic resistance of the substrate to the oxide below the inductor metal, can be indicated in field 398.

Figure 4:
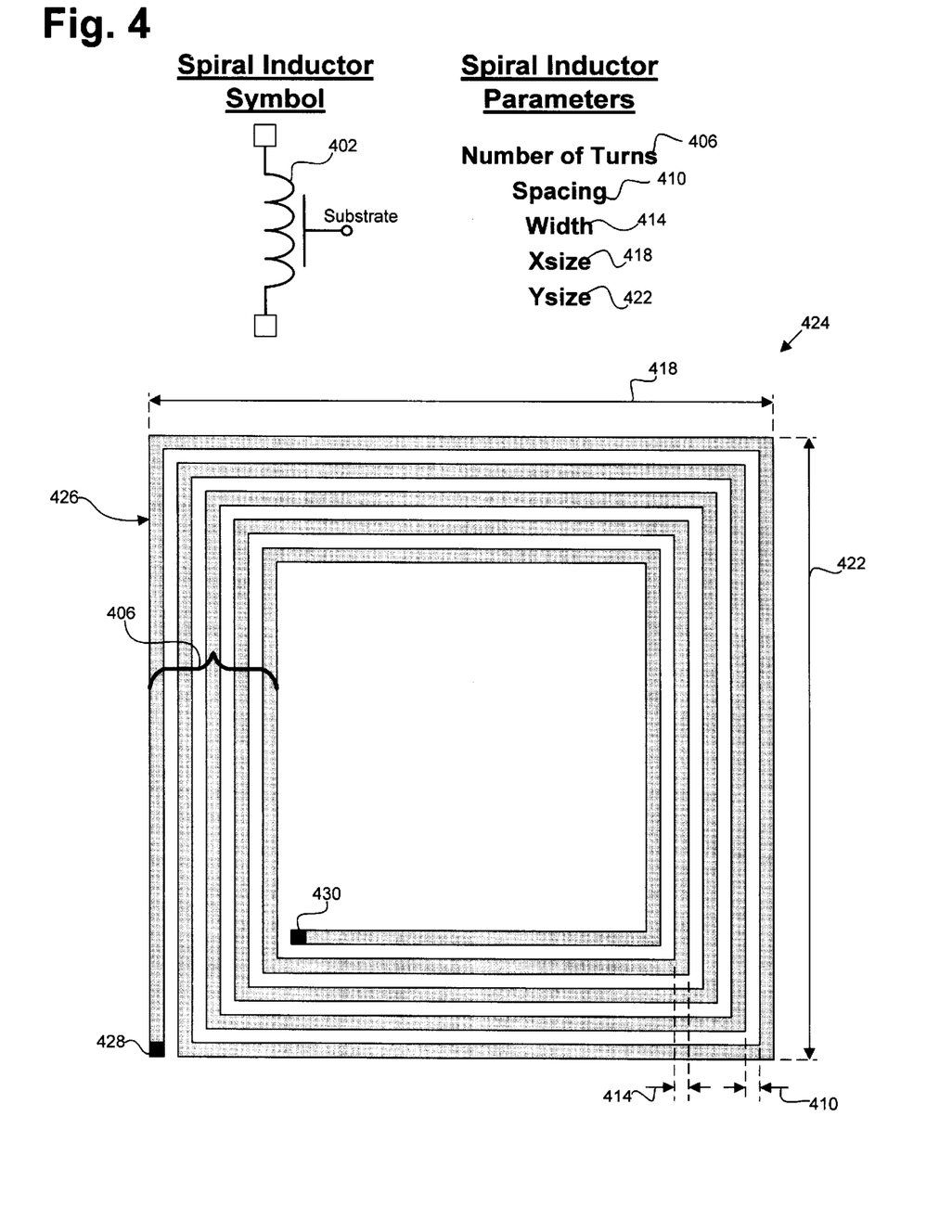
FIG. 4 shows a symbol, parameters and corresponding exemplary layout of a spiral inductor according to an embodiment of the present invention.

FIG. 4 shows a symbol and the corresponding parameters and layout of an exemplary spiral inductor. In FIG. 4, spiral inductor symbol 402 is an example of a symbol used in a circuit schematic to indicate a spiral inductor. Number of Turns 406, Spacing 410, Width 414, Xsize 418, and Ysize 422 are exemplary spiral inductor parameters utilized in an exemplary embodiment of the present invention to predict the parasitics of a spiral inductor layout that will be generated using the same spiral inductor parameters listed above. Number of Turns 406, Spacing 410, Width 414, Xsize 418, and Ysize 422 correspond to Number of Turns 306, Spacing 310, Width 314, Xsize 318, and Ysize 322 in FIG. 3.

As shown in FIG. 4, spiral inductor layout 424 includes spiral inductor metal segments 426, which form an exemplary shape of a square. The shape of spiral inductor metal segments 426 is determined by spiral inductor parameters Xsize 418 and Ysize 422. Manifestly, when the value of Xsize 418 equals the value of Ysize 422, i.e. when the total width of spiral inductor metal 426 in the "x" direction equals the total length of spiral inductor metal in the "y" direction, inductor metal 426 will have a square shape. Spiral inductor layout 424 includes terminal 428, which is situated at a first end of spiral inductor metal 426, and terminal 430, which is situated at a second end of spiral inductor metal 426. Since terminal 428 is situated on the "outside" of the spiral formed by spiral inductor metal segments 426, terminal 428 can directly interconnect to external circuitry in the same metal level as spiral inductor metal segments 426. However, since terminal 430 is situated on the inside of the spiral formed by spiral inductor metal segments 426, terminal 430 cannot be directly interconnected to external circuitry in the same metal level as spiral inductor metal segments 426. For example, if spiral inductor metal segments 426 are fabricated in metal level 2, terminal 430 can be connected to external circuitry through an underpass (not shown in FIG. 4) fabricated in metal level 1.

Also shown in FIG. 4, the total width of spiral inductor metal segments 426 in the "x" direction is indicated by Xsize 418, and the total length of spiral inductor metal segments 426 in the "y" direction is indicated by Ysize 422. For example, Xsize 418 can be 200.0 microns and Ysize 422 can also be 200.0 microns. The number of turns of spiral inductor metal 426 is indicated by Number of Turns 406. As shown in FIG. 4, spiral inductor metal segments 426 has 5.0 turns, as indicated by bracket 406. The distance between adjacent segments of spiral inductor metal segments 426 is indicated by Spacing 410, and the width of a segment of spiral inductor metal 426 is indicated by Width 414. For example, Spacing 410 can be 3.0 microns and Width 414 can be 4.0 microns.

Figure 5:
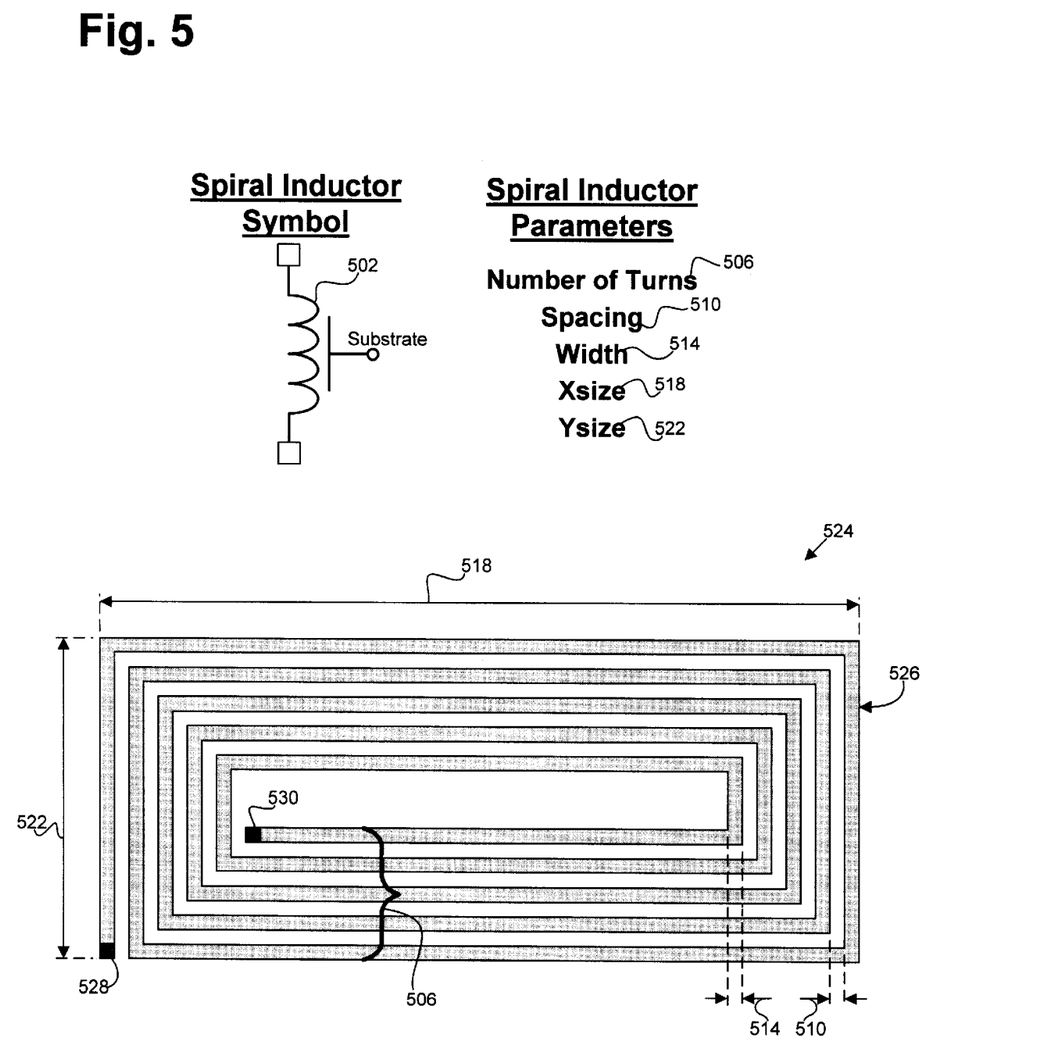
FIG. 5 shows a symbol, parameters and corresponding exemplary layout of a spiral inductor according to an embodiment of the present invention.

FIG. 5 shows a symbol and the corresponding parameters and layout of an exemplary spiral inductor. In FIG. 5, spiral inductor symbol 502 is a symbol used in a circuit schematic to indicate a spiral inductor. Number of Turns 506, Spacing 510, Width 514, Xsize 518, and Ysize 522 are exemplary spiral inductor parameters utilized in an exemplary embodiment of the present invention to predict the parasitics of a spiral inductor layout that will be generated using the same spiral inductor parameters listed above. Number of Turns 506, Spacing 510, Width 514, Xsize 518, and Ysize 522 correspond to Number of Turns 306, Spacing 310, Width 314, Xsize 318, and Ysize 322 in FIG. 3, and also correspond to Number of Turns 406, Spacing 410, Width 414, Xsize 418, and Ysize 422 in FIG. 4. Additionally, terminals 528 and 530, respectively, correspond to terminals 428 and 430 in FIG. 4.

As shown in FIG. 5, spiral inductor layout 524 includes spiral inductor metal segments 526, which in the present example form a rectangle. Similar to spiral inductor layout 424 in FIG. 4, spiral inductor layout 524 is also determined by the corresponding spiral inductor parameters Number of Turns 506, Spacing 510, Width 514, Xsize 518, and Ysize 522. For example, spiral inductor parameters Xsize 518 equal to 300.0 microns, Ysize 522 equal to 100.0 microns, Spacing 510 equal to 2.0 microns, Width 514 equal to 3.0 microns, and Number of Turns equal to 5.0 can be selected.

Figure 6:
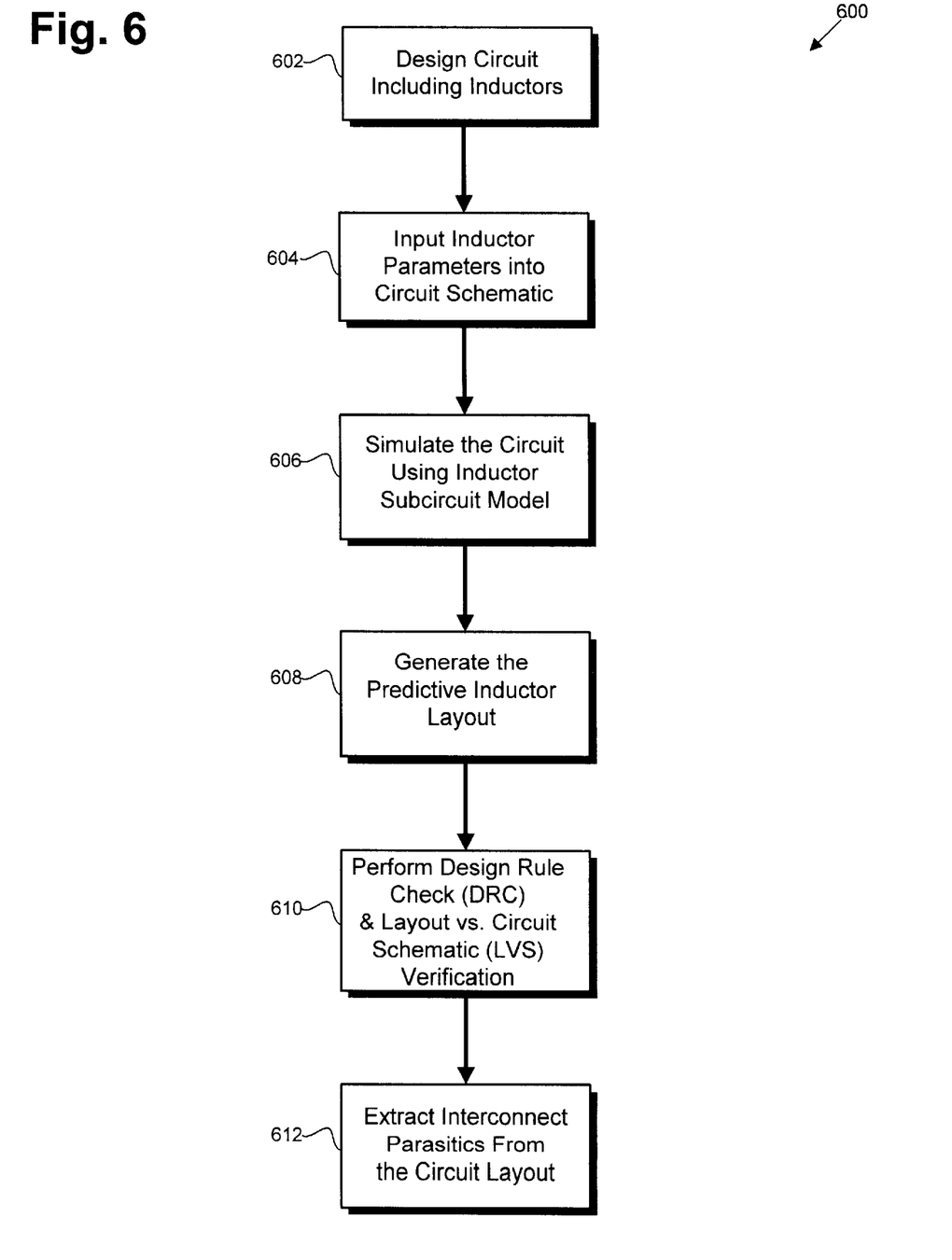
FIG. 6 is a flowchart illustrating a sequence of steps in accordance with an embodiment of the present invention.

FIG. 6 shows flowchart 600, which illustrates a sequence of steps in accordance with an embodiment of the present invention. In step 602, a circuit comprising at least one spiral inductor is designed. In an embodiment of the invention, a circuit can be designed and a circuit schematic assembled with the assistance of a commercial schematic design editor, such as Composer®, by Cadence Design Systems®, Inc. In step 604, spiral inductor parameters that exactly determine the layout of the spiral inductor are input in the circuit schematic. For example, parameters "Number of Turns," "Spacing," "Width," "Xsize," and "Ysize," respectively, corresponding to Number of Turns 306, Spacing 310, Width 314, Xsize 318, and Ysize 322 in FIG. 3 are input in the circuit schematic. In the present invention, the above parameters can be input in the circuit schematic using a schematic design editor, such as Composer®, by Cadence Design Systems®, Inc.

In step 606 in FIG. 6, the circuit is simulated using the invention's spiral inductor subcircuit model 200 in FIG. 2. The invention's spiral inductor subcircuit model 200 is calibrated to predict the electrical behavior of a spiral inductor, including the spiral inductor's internal parasitics, using the above listed parameters that were input in the circuit schematic in step 604. In a conventional circuit design cycle, such as the design cycle shown in flowchart 100 in FIG. 1, a designer would not know the values of the spiral inductor's internal parasitics until after the parasitics were extracted from the circuit layout in a later step in the design cycle, such as step 108 in FIG. 1. In contrast to the conventional circuit design cycle, the present invention predicts, i.e. has advance knowledge of, the spiral inductor's internal parasitics before the spiral inductor layout is generated.

This prediction is achieved in part due to the fact that the same spiral inductor parameters, such as Number of Turns, Spacing, Width, Xsize, and Ysize, utilized to arrive at the exact layout of the inductor are also used to determine the inductor subcircuit model parasitic components such as Rp, Rs, Rsub1, Rsub2, Cp, Cox1, Cox2, Csub1, and Csub2. By way of an example, an increase in spiral inductor parameter "Number of Turns" would increase the length of the spiral inductor metal segments in the spiral inductor layout. An increase in length of the spiral inductor metal segments would also increase the resistance of the spiral inductor, and would thus result in an increase in Rs, the spiral inductor parasitic series resistance. Also, an increase in length of the spiral inductor metal segments would increase the total area of the spiral inductor metal segments, and would thus result in an increase in Cox1 and Cox2, the parasitic capacitances between the spiral inductor and the substrate.

By way of another example, a decrease in the value of spiral inductor parameter "Spacing," i.e. a decrease in the distance between adjacent spiral inductor metal segments in a spiral inductor layout, would increase the capacitive coupling between adjacent segments of spiral inductor metal. An increase in capacitive coupling between adjacent segments of spiral inductor metal would thus increase Cp, the spiral inductor's parasitic parallel capacitance. Still by way of a further example, an increase in spiral inductor parameter "Width" would increase the width of the spiral inductor metal segments. Wider segments of spiral inductor metal would, for example, result in a decrease in Rs, the spiral inductor's parasitic series resistance.

As yet another example, an increase in spiral inductor parameters "Xsize" or "Ysize" would increase the area of the spiral inductor metal segments. An increased area of spiral inductor metal segments would thus result in an increase in Cox1 and Cox2, the parasitic capacitances between the spiral inductor and the substrate. Thus, the present invention enables a designer to design a circuit that incorporates an inductor's internal parasitics prior to the inductor layout generation. In other words, the present invention enables the designer to design a circuit using knowledge of the values of the parasitics in an inductor layout before the inductor layout is generated.

In step 608, a "predictive" spiral inductor layout is generated in a layout generator. For example, the layout generator uses spiral inductor parameters, i.e. "Number of Turns," "Spacing," "Width," "Xsize," and "Ysize," that were input in the circuit schematic in step 604 to generate a spiral inductor layout. In other words, the layout generator interprets the values of the input spiral inductor parameters and builds a layout representation of the spiral inductor. According to the present invention, the spiral inductor layout generated in step 608 results in parasitic resistors Rp 212, Rs 208, Rsub1 224, and Rsub2 230, and parasitic capacitors Cp 202, Cox1 216, Cox2 226, Csub1 220, and Csub2 232 (all shown in FIG. 2) that were already used in step 606 to perform circuit simulation.

Thus, according to the present invention, the layout generated at step 608 has, in effect, resulted in advance knowledge of the values of the internal parasitic resistors and capacitors of the spiral inductor. As such, the values of the internal parasitic resistors and capacitors of the spiral inductor have been accurately predicted and utilized during circuit simulation. Therefore, according to the present invention, there is no need for an extraction of the values of the internal parasitic resistors and capacitors of an already laid out spiral inductor. Further, there is generally no need to re-simulate the circuit with extracted values of the spiral inductor internal parasitic resistors and capacitors. In other words, the simulation performed at step 606 has already taken into account accurate values of internal parasitic resistors and capacitors of the spiral inductor.

In step 610 in FIG. 6, a design rule check ("DRC") and a layout vs. circuit schematic ("LVS") verification are performed on the circuit layout generated in step 608. DRC is performed to ensure that the circuit layout does not violate any manufacturing specifications. For example, the DRC program identifies problems such as "minimum-spacing" violations and "minimum-width" violations. In LVS, the circuit layout is checked to ensure that the layout is electrically equivalent to the circuit schematic and accurately represents the parameters input in the circuit schematic. In other words, checks are employed to ensure that the circuit layout does in fact represent the same topology specified by the circuit schematic.

In step 612, interconnect parasitics are extracted from the circuit layout. The interconnect parasitics extracted in step 612 do not include parasitics that are internal to the spiral inductor since the spiral inductor internal parasitics are already accurately known according to the present invention as described above. The parasitics that are extracted in step 612 are those parasitics that are generated by interconnect routing between the spiral inductor and other circuit components. In an embodiment of the present invention, a commercial extraction tool, such as xCalibre®, is used for interconnect parasitic extraction. The commercial extraction tool is instructed to treat the spiral inductor as a "black box" and not extract any parasitics inside the "black box." In other words, the commercial extraction tool only extracts parasitics that are generated by interconnect routing between the "black box," i.e. the spiral inductor, and other circuit components. The parasitics inside the spiral inductor can be ignored in step 612 because the spiral inductor's internal parasitics were accurately predicted and utilized in the circuit simulation step 606.

Since much fewer parasitics have to be considered, post-layout simulation of a circuit comprising spiral inductors in the present invention is much faster and more predictable than post-layout simulation of the same circuit in a conventional design system. In other words, during post-layout simulation of a circuit comprising spiral inductors in the present invention, only the extracted interconnect parasitics must be taken into account. Thus, the present invention accommodates circuit design and layout generally in a single pass or, at worst case, without many circuit design, simulation, and layout generation cycles, as required by conventional design systems.

It is noted that post-layout simulation of a circuit comprising spiral inductors in a conventional design system is quite unpredictable. Thus circuit modification in a conventional design system can be quite extensive due to the large number of inductor internal parasitics that are extracted from the circuit layout. As a result, a conventional design system typically requires many iterations, such as iteration of steps 102, 104, 106, and 108 in FIG. 1, before the circuit design and layout generation cycles are completed. Thus, by generating an acceptable circuit layout and without requiring many iterations, the present invention's design system greatly reduces the time-to-market for circuits comprising inductors.

Figure 7:
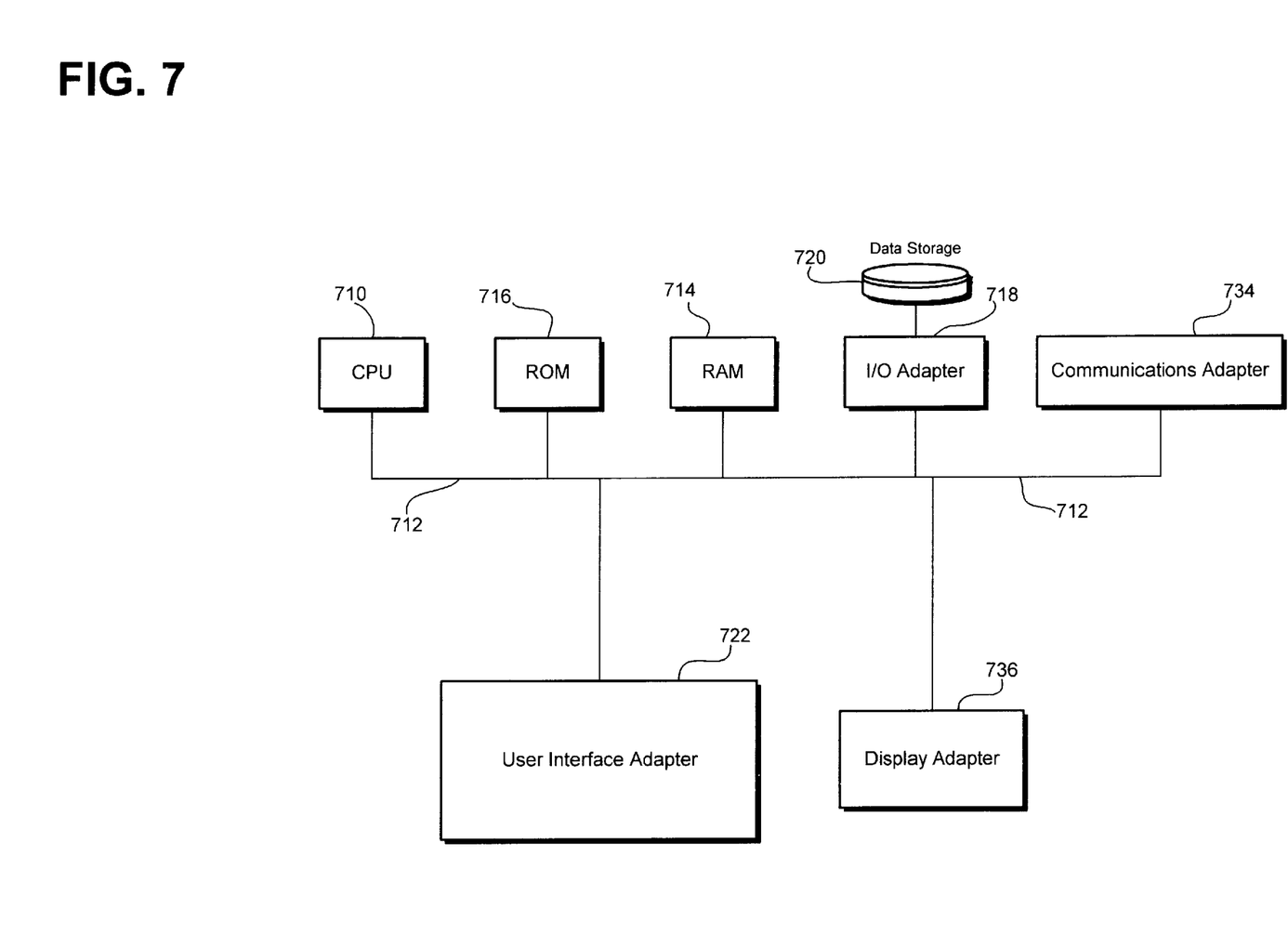
FIG. 7 shows a block diagram of a generic computer which can be utilized to implement an embodiment of the present invention.

Turning attention to an exemplary hardware for implementing the present invention, a typical computer that can be programmed to implement the invention is shown in FIG. 7. The computer programmed to implement the invention is typically part of a "system" of interconnected computers. Alternatively, the computer shown in FIG. 7 may itself be referred to as a "system" in the present application. The exemplary computer shown in FIG. 7 comprises a Central Processing Unit (CPU) 710, a Read Only Memory (ROM) 716, a Random Access Memory (RAM) 714, an Input/Output (I/O) Adapter 718, a disk storage (also called a hard drive) 720, a communications adapter 734, a user interface adapter 722, and a display adapter 736. Bus 712 couples CPU 710, ROM 716, RAM 714, I/O Adapter 718, communications adapter 734, user interface adapter 722, and display adapter 736 as shown in FIG. 7. User interface adapter 722 is typically coupled to an input device such as a keyboard (not shown in FIG. 7) to permit a user to communicate with and control the computer. Display adapter 736 is typically coupled to a monitor (not shown in FIG. 7) for the purpose of communicating and interacting with the user. By way of a more specific example, the computer shown in FIG. 7 may be a computer system such as HP® 9000 or Sun Solaris® workstation that uses a 32-bit RISC type CPU as CPU 710. However, it is understood and appreciated by those skilled in the art that the invention may also be implemented using a variety of different types of computers other than those specifically mentioned in the present application.

It is appreciated by the above detailed description that the invention provides method and system for predictive layout generation for inductors with reduced design cycle. The invention provides an integrated design system that is able to predict the size and effect of an inductor's internal parasitics and thereby use that knowledge to minimize undesirable repetition of steps in the circuit design system.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, it is manifest from the above description that spiral inductor subcircuit model 200 can include a greater number or a fewer number of parasitic resistors and capacitors. Moreover, the spiral inductor subcircuit model can have a different circuit topology than that shown in FIG. 2. However, any differences are a matter of design choice and the invention's principles disclosed herein can be manifestly applied to any spiral inductor subcircuit model of choice. Moreover, although the invention has been described by reference to a spiral inductor, it is manifest to one of ordinary skill in the art that the invention applies to circuits that employ inductors that are not "spiral" in shape. In other words, the label "spiral inductor" has been used merely as an example while the invention is also applicable to "non-spiral" inductors. Additionally, although the invention has been described by reference to square and rectangular spiral inductors, i.e. spiral inductors having four sides, the invention is also applicable to spiral inductors with fewer or greater than four sides, such as an octagonal spiral inductor, i.e. a spiral inductor having eight sides. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and system for predictive layout generation for inductors with reduced design cycle have been described.

What is claimed is:

1. A method comprising steps of:
   receiving a plurality of parameter values for an inductor, said plurality of parameter values determining a plurality of parasitic values of a subcircuit model of said inductor;
   generating a layout of said inductor utilizing said plurality of parameter values, said layout causing said inductor to have said plurality of parasitic values.

2. The method of claim 1 wherein said inductor is a spiral inductor.

3. The method of claim 2 wherein each of said plurality of parameter values is selected from the group consisting of Number of Turns, Spacing, Width, Xsize, and Ysize parameter values.

4. The method of claim 3 wherein said Number of Turns parameter value determines a number of turns in metal segments of said spiral inductor.

5. The method of claim 3 wherein said Spacing parameter value determines a separation distance between adjacent metal segments of said spiral inductor.

6. The method of claim 3 wherein said Width parameter value determines a width of a metal segment of said spiral inductor.

7. The method of claim 3 wherein said Xsize parameter value determines a total width of said spiral inductor.

8. The method of claim 3 wherein said Ysize parameter value determines a total length of said spiral inductor.

9. The method of claim 1 further comprising a step of utilizing said plurality of parasitic values to simulate an electrical behavior of said inductor prior to said generating step.

10. The method of claim 9 wherein said inductor is a spiral inductor.

11. The method of claim 1 wherein said parasitic values of said subcircuit model comprise a plurality of parasitic resistor values and a plurality of parasitic capacitor values.

12. The method of claim 11 wherein said plurality of parasitic resistor values and said plurality of parasitic capacitor values are determined by said plurality of parameter values.

13. The method of claim 11 further comprising a step of utilizing said plurality of resistor values and said plurality of capacitor values to simulate an electrical behavior of said inductor prior to said generating step.

14. A method for designing a circuit including at least one inductor, said method comprising steps of:
   receiving a plurality of parameter values for said at least one inductor;
   determining a plurality of parasitic values in a subcircuit model for said at least one inductor;
   simulating an electrical behavior of said circuit utilizing said plurality of parasitic values;
   generating a layout of said circuit including said at least one inductor, said layout causing said at least one inductor to have said plurality of parasitic values.

15. The method of claim 14 wherein said inductor is a spiral inductor.

16. The method of claim 15 wherein each of said plurality of parameter values is selected from the group consisting of Number of Turns, Spacing, Width, Xsize, and Ysize parameter values.

17. The method of claim 16 wherein said Number of Turns parameter value determines a number of turns in metal segments of said spiral inductor.

18. The method of claim 16 wherein said Spacing parameter value determines a separation distance between adjacent metal segments of said spiral inductor.

19. The method of claim 16 wherein said Width parameter value determines a width of a metal segment of said spiral inductor.

20. The method of claim 16 wherein said Xsize parameter value determines a total width of said spiral inductor.

21. The method of claim 16 wherein said Ysize parameter value determines a total length of said spiral inductor.

22. The method of claim 14 further comprising a step of performing a design rule check after said step of generating said layout.

23. The method of claim 14 further comprising a step of performing a layout versus schematic verification after said step of generating said layout.

24. The method of claim 14 further comprising a step of extracting interconnect parasitics after said step of generating said layout.

25. The method of claim 14 wherein said parasitic values of said subcircuit model comprise a plurality of parasitic resistor values and a plurality of parasitic capacitor values.

26. The method of claim 25 wherein said plurality of parasitic resistor values and said plurality of parasitic capacitor values are determined by said plurality of parameter values.

27. The method of claim 25 further comprising a step of utilizing said plurality of resistor values and said plurality of capacitor values to simulate an electrical behavior of said at least one inductor prior to said step of generating said layout.

28. A system comprising a computer for designing a circuit including at least one inductor, said computer implementing a method comprising steps of:
- said computer receiving a plurality of parameter values for said at least one inductor in said circuit;
- said computer determining a plurality of parasitic values in a subcircuit model of said at least one inductor;
- said computer generating a layout of said at least one inductor utilizing said plurality of parameter values, said layout causing said at least one inductor to have said plurality of parasitic values.

29. The system of claim 28 wherein said inductor is a spiral inductor.

30. The system of claim 29 wherein each of said plurality of parameter values is selected from the group consisting of Number of Turns, Spacing, Width, Xsize, and Ysize parameter values.

31. The system of claim 30 wherein said Number of Turns parameter value determines a number of turns in metal segments of said spiral inductor.

32. The system of claim 30 wherein said Spacing parameter value determines a separation distance between adjacent metal segments of said spiral inductor.

33. The system of claim 30 wherein said Width parameter value determines a width of a metal segment of said spiral inductor.

34. The system of claim 30 wherein said Xsize parameter value determines a total width of said spiral inductor.

35. The system of claim 30 wherein said Ysize parameter value determines a total length of said spiral inductor.

36. The system of claim 28 wherein said method further comprises a step of utilizing said plurality of parasitic values to simulate an electrical behavior of said inductor prior to said generating step.

37. The system of claim 26 wherein said inductor is a spiral inductor.

38. The system of claim 28 wherein said parasitic values of said subcircuit model comprise a plurality of parasitic resistor values and a plurality of parasitic capacitor values.

39. The system of claim 38 wherein said plurality of parasitic resistor values and said plurality of parasitic capacitor values are determined by said plurality of parameter values.

40. The system of claim 38 wherein said method further comprises a step of utilizing said plurality of resistor values and said plurality of capacitor values to simulate an electrical behavior of said inductor prior to said generating step.

* * * * *